(12) United States Patent
Rayssac et al.

(10) Patent No.: US 6,991,944 B2
(45) Date of Patent: Jan. 31, 2006

(54) SURFACE TREATMENT FOR MULTI-LAYER WAFERS FORMED FROM LAYERS OF MATERIALS CHOSEN FROM AMONG SEMICONDUCTING MATERIALS

(75) Inventors: Olivier Rayssac, Grenoble (FR); Beryl Blondeau, La Tronche (FR); Hubert Moriceau, Saint Egreve (FR); Christelle Lagahe-Blanchard, Saint Joseph la Riviere (FR); Franck Fournel, Moirans (FR)

(73) Assignees: S.O.I.Tec Silicon on Insulation Technologies S.A., Bernin (FR); Commissariat à l'Energie Atomique (CEA), Paris (FR)

( * ) Notice: Subject to any disclaimer, the term of this patent is extended or adjusted under 35 U.S.C. 154(b) by 2 days.

(21) Appl. No.: 10/915,769

(22) Filed: Aug. 10, 2004

(65) Prior Publication Data

US 2005/0130429 A1    Jun. 16, 2005

(30) Foreign Application Priority Data

Dec. 10, 2003   (FR)   .................................... 0314463

(51) Int. Cl.
*H01L 21/302* (2006.01)
(52) U.S. Cl. .................. 438/13; 438/459; 438/663; 438/690; 438/692; 438/974; 216/72; 216/95
(58) Field of Classification Search ............... 438/7, 438/13, 149, 164, 459, 663, 690, 692, 714, 438/974; 216/59, 72, 84, 95
See application file for complete search history.

(56) References Cited

U.S. PATENT DOCUMENTS

| 5,208,182 | A | * | 5/1993 | Narayan et al. | ............. 438/509 |
| 5,395,788 | A | | 3/1995 | Abe et al. | ...................... 437/61 |
| 6,150,239 | A | | 11/2000 | Goesel et al. | ............... 438/458 |
| 6,500,732 | B1 | | 12/2002 | Henley et al. | ............... 438/459 |
| 2002/0061631 | A1 | * | 5/2002 | Miyabayashi et al. | ...... 438/478 |
| 2004/0171257 | A1 | * | 9/2004 | Neyret et al. | ............... 438/689 |

FOREIGN PATENT DOCUMENTS

WO    WO 02/27783 A1    4/2002

OTHER PUBLICATIONS

"Nitrogen Implantation in 100 Beta-SiC Layers Grown On Si Substrate";Hirano et. al.; Journal of Applied Physics 77(3); pp. 1020-1028; 1995'.*
"Quenched-In Defect Removal Through Silicide Formation By Rapid Thermal Processing"; Mathiot; Applied Physics Letters 58(2); pp. 131-133; 1991'.*
D. Buttard et al., "Toward Two-Dimensional Self-Organization of Nanostructurres Using Wafer Bondig and Nanopatterned Silicon Surfaces," IEEE Journal of Quantum Electronics, vol. 38, No. 8, pp. 1995-1005 (Aug. 2002).

* cited by examiner

*Primary Examiner*—George A. Goudreau
(74) *Attorney, Agent, or Firm*—Winston & Strawn LLP

(57) ABSTRACT

This invention relates to a process for treatment of a multi-layer wafer with materials having differential thermal characteristics, the process comprising a high temperature heat treatment step that can generate secondary defects, characterised in that this process includes a wafer surface preparation step before the high temperature heat treatment step.

29 Claims, 4 Drawing Sheets

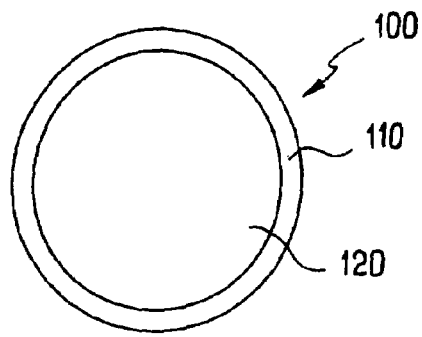
FIG.4a
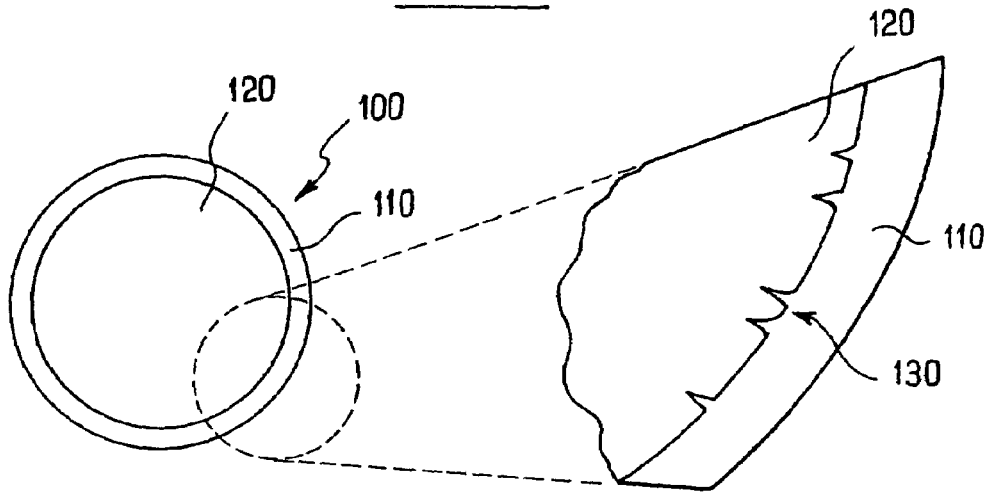
FIG.4b1  FIG.4b2
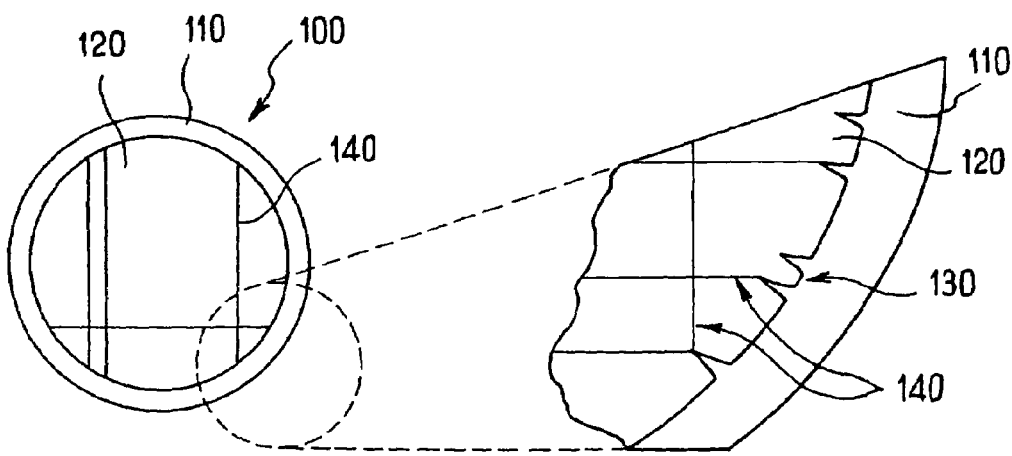
FIG.4c1  FIG.4c2

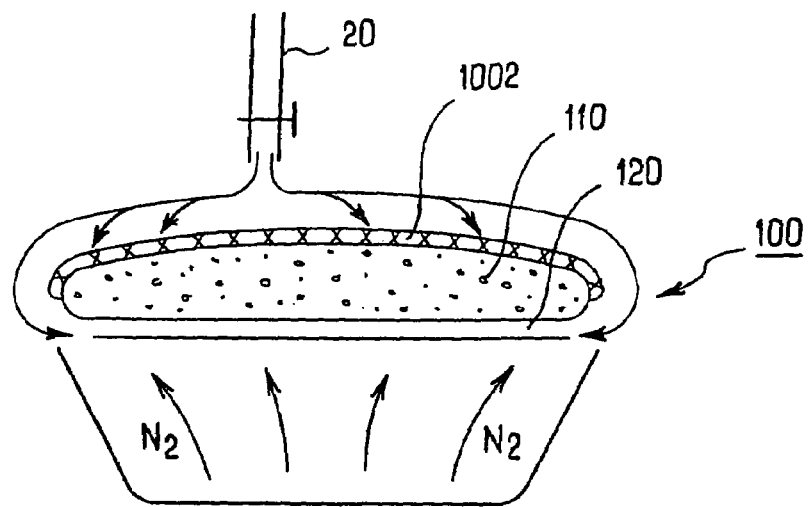
FIG_6
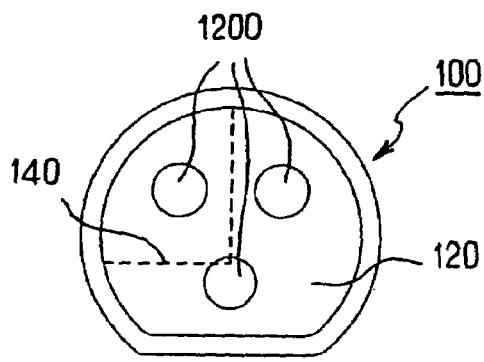
FIG_7a
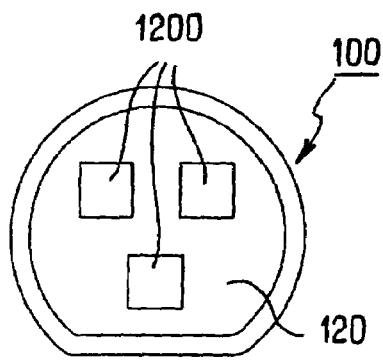
FIG_7b
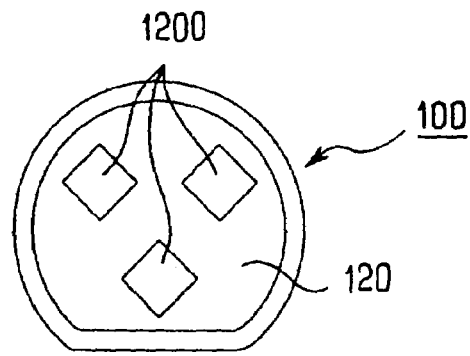
FIG_7c

SURFACE TREATMENT FOR MULTI-LAYER WAFERS FORMED FROM LAYERS OF MATERIALS CHOSEN FROM AMONG SEMICONDUCTING MATERIALS

TECHNICAL FIELD

This invention relates in general to surface treatment of multi-layer wafers formed from layers of materials chosen from among semiconducting materials. More precisely, the invention relates to a process for treatment of a multi-layer wafer with materials having differential thermal characteristics, as defined herein, with the process comprising a high temperature heat treatment step that can generate secondary defects.

BACKGROUND ART

Note that a "wafer" means a structure that may include one or several layers. In the case of a multi-layer wafer, the different layers may have been associated with each other by any type of technique known in itself (layer transfer, gluing, epitaxy, etc.). Thus, a multi-layer wafer is such a structure that contains several layers. And the wafers concerned by this invention are wafers comprising a thin surface layer (made of a material such as silicon) for applications in micro-electronics. Remember that the useful layer is generally a surface layer of the wafer, on which components will be created. Such a surface layer is generally considered as the working surface of the wafer. This layer and its working surface must be of very good quality and free from defects for optimum results.

For applications in microelectronics, it is frequently necessary to perform heat treatment of the wafer—for example heat treatment designed to improve the surface condition of the surface layer of the wafer or thinning by sacrificial oxidation. Surface treatments are also known involving a high temperature heat treatment. The term "high temperature heat treatment" in this text denotes a heat treatment in which at least some phases are carried out at temperatures of several hundred degrees, for example exceeding 750° C. for silicon films in a silicon on Quartz (SOQ—Silicon On Quartz) structure. For different materials, high temperatures can exceed 500° C., 1000° C. or even 1100° C. Note that this high temperature heat treatment definition is not absolute: it is simply given in the context of this text, and it can cover other temperature ranges outside the context of the invention and the previously mentioned typical temperatures.

This type of heat treatment can be carried out according to an RTA (Rapid Thermal Annealing) mode, for a limited time (of the order of a few seconds to a few minutes only). But RTA mode is not limitative and the invention is applicable to any other type of high temperature heat treatment. For example, this type of heat treatment may be applied to wafers concerned by the invention. Other types of heat treatment may be intended to modify the structure of the wafer, and/or to improve the surface condition of the wafer. For example surface treatments involving smoothing annealing are also known. In particular, this type of annealing lowers the surface roughness of a surface layer of a semiconducting material (for example such as silicon) to values compatible with specifications in force in the semiconducting industry.

Thus, one process well adapted to this effect in the case of a surface layer of silicon, consists of performing a smoothing annealing on the wafer comprising the layer, under a reducing atmosphere and, particularly under a hydrogen atmosphere) at a high temperature (that may be more than 950° C. and, for example, 1100° C.). "Smoothing annealing" is thus defined as being annealing carried out under a reducing atmosphere at high temperature—and more precisely at a temperature of the order of 950° C. or more. Smoothing annealing is thus a particular form of high temperature heat treatment. This type of annealing can be carried out for a relatively long time (for example, on the order of two hours). It can also be done in RTA mode at a very high temperature (of the order of 1100° C. or more), for a duration of only a few seconds to a few minutes. This type of annealing smoothes the surface of the wafer. It can also cure some structural defects.

According to known processes, this type of high temperature heat treatment is done on the wafer once it has been created (in other words once operations have been carried out in advance—for example transfer of layers and gluing and/or epitaxy—necessary for creation of the multi-layer wafer). However, these known high temperature heat treatments cannot be used on all types of wafers, since there are some limitations associated with them.

The application of this type of high temperature heat treatment to the treatment of single-layer wafers, or multi-layer wafers in which the different layers have differential thermal characteristics, can be problematic. Note that "differential thermal characteristics" means that the different layers of the wafer behave or respond differently during exposure to a given thermal budget or other high temperature heat treatment. This type of differential generally corresponds to a difference in the coefficients of thermal expansion of materials forming the different layers of the wafer, combined with dimensional characteristics of these layers. And more precisely, in the context of this text, "differential thermal characteristics" of a multi-layer structure are characterized as follows for the purposes of this text:

at least some layers of the structure are associated with different coefficients of thermal expansion, and there is at least one layer with a significant thickness close to the surface layer (in this case the term "significant thickness" is defined as being a thickness of at least an order of magnitude greater than (namely 10 times greater than) the thickness of the surface layer) that is associated with a coefficient of thermal expansion significantly different from the coefficient of thermal expansion associated with the surface layer.

"Thermal Budget" is used in the present invention to mean the amount of thermal energy to be applied to a substrate that includes a weakened zone for thermally detaching or cleaving of the substrate at the weakened zone. This is equal to 100% of the necessary energy at which detachment occurs thermally. The temperature-time-dependency of the thermal detachment budget follows Arrhenius Law in which the reciprocal of the annealing time is proportional to the exponent of the reciprocal of the annealing temperature. The budget of thermal detachment of heterogeneous bonded structures is dependent on a number of material, environmental and technological parameters such as the type of material, implantation conditions and bonding conditions.

An SOQ type wafer, comprising a thin surface layer of silicon directly associated with a Quartz support layer with a significant thickness, is thus a typical example of such a structure for which the layers have differential thermal characteristics. In the case of this type of wafer that relaxes after exposure to a large thermal budget (such as thermal budgets that occur with the treatments mentioned above), the thin surface layer of silicon recovers a significant part of the mechanical stresses generated by exposure of the wafer to the thermal budget. In this case, the thin surface layer of silicon, for which the coefficient of thermal expansion is of the order of $2.5 \times 10^{-6}$ K$^{-1}$, which is five times greater than the corresponding value for the subjacent Quartz layer which is of the order of $0.5 \times 10^{-6}$ K$^{-1}$, naturally tends to expand to relax stresses caused by heating.

Note that the coefficient of thermal expansion is defined as being a dimensional variation compared with a reference dimension, per degree of temperature difference. This coefficient is therefore expressed in K$^{-1}$. But at the same time, the subjacent layer of Quartz to which the surface layer of silicon is fixed does not tend to expand in the same way, and this applies stresses to the surface silicon layer.

In the frequent case in which the surface of the thin layer of silicon includes defects (corresponding to "initial" defects that will be defined in more detail in the remainder of the text), such defects vary under the effect of the said stresses to produce secondary defects of the types defined below, e.g., dislocation type defects.

A wafer for which only a very thin buried layer has a coefficient of thermal expansion significantly different from the coefficient of thermal expansion of the material in the surface layer would not correspond to the definition of a wafer given above for which the layers have "differential thermal characteristics". A conventional SOI (Silicon On Insulator) type wafer is thus an example of a wafer comprising a surface layer of silicon, under which there is firstly a very thin layer of $SiO_2$, then a thick support layer that is typically made of silicon. In this case, the buried layer $SiO_2$ is associated with a coefficient of thermal expansion that is significantly different from the coefficient of thermal expansion associated with the silicon surface layer, but no secondary defect generation is observed like that mentioned above.

In the case of SOI, the $SiO_2$ layer is buried between two silicon layers that have thicknesses comparable to the SOI layer or are thicker. The very thin layer of $SiO_2$ under these conditions cannot "impose" its mechanical behavior when exposed to high thermal stresses. Finally, note that it would certainly be possible to observe secondary defects of the dislocation type in the layer of $SiO_2$ itself, but since the material in this layer is amorphous, it does not generate any dislocation type crystalline defects.

Returning to the presentation of the problem that the invention is intended to solve, when a wafer for which the layers have a differential thermal characteristic receives a large thermal budget, at least one of the layers of the wafer may be affected by high mechanical stresses due to the difference in expansion of the different layers under the effect of the received heat load. Remember that the different layers in a wafer remain fixed to each other.

The appearance of "secondary" defects in SOQ wafers has been observed following high temperature heat treatment like that mentioned above (for example, possibly a smoothing annealing, a heat treatment under neutral gas, oxidation, etc.). The term "quartz" as used in this specification means molten silica. In the example of an SOQ structure, the observed defects are located in the silicon film and in particular are crystalline defects corresponding to "secondary defects", since they are generated during the high temperature heat treatment and are related to the initial defects already present in the wafer. Note that in particular, secondary defects may be dislocation type defects, or other crystalline defects associated with initial defects.

"Initial defects" means defects that are already present in materials from which the wafer is composed, or defects generated during one of the steps in initial manufacture of the wafer, before application of the heat treatment associated with appearance of secondary defects (in particular, these initial defects may be sharp edges caused by the strong roughness after detachment of the wafer from a donor substrate).

In general, the appearance of secondary defects in multi-layer wafers has been observed with differential thermal characteristics when the wafers are exposed to a high temperature heat treatment step (for example, the heat treatment may be a smoothing annealing or an RTA treatment, or an oxidation annealing, or in general a high temperature heat treatment). This undesirable effect is shown in FIGS. 1 and 2, which represent observations obtained by TEM (Transmission Electronic Microscopy) on a section through two SOQ wafers (one control indicating the scale of the figure in its bottom left corner). These two figures show a section through the upper part of an SOQ wafer on which a high temperature heat treatment has been conducted. This top part corresponds to the surface layer of Si, and to (at least part of) the $SiO_2$ layer inserted between the surface layer of Si and the Quartz support of the wafer (support not shown).

Thus, FIG. 1 illustrates a dislocation passing through the entire thickness of the surface layer of crystalline silicon (separated from a quartz layer that is not shown on the figures and is located below an $SiO_2$ layer). This type of dislocation is obviously a very serious defect for the silicon surface layer.

FIG. 2 illustrates a loop dislocation 20 that also creates a serious disadvantage. Note that this type of defect generated by smoothing annealing and sometimes extending through the entire thickness of the surface layer (400 nm in the example in FIG. 1) cannot be completely eliminated by thinning the layer, for example by polishing after the said annealing. This type of defect appears particularly when the surface of the multi-layer wafer has initial defects before being exposed to annealing.

In this case, the initial defects are involved in secondary defect generation mechanisms (of the dislocation type in FIGS. 1 and 2) under the effect of mechanical stresses resulting from exposure to a heat budget of the multi-layer wafer with differential thermal characteristics, starting from initial defects already present in the wafer before the high temperature heat treatment. For example, the initial defects might be disturbances on the wafer surface. These initial defects may have been created during previous treatment steps applied to the wafer.

FIG. 3 thus illustrates the layer of silicon in the SOQ wafer in FIGS. 1 and 2 before a high temperature heat treatment was applied to it, with this FIG. 3 showing a disturbed silicon surface. The disturbances on this surface layer may for example correspond to initial defects that will be involved during a high temperature heat treatment in the generation of secondary defects.

Thus, there is a need to minimize or even eliminate such secondary defects. In addition, there is a need to avoid generating defect lines during high temperature heat treatments of various wafers. The present invention now satisfies these needs.

SUMMARY OF THE INVENTION

The present invention provides a treatment process for a multi-layer wafer for which the materials have differential thermal characteristics, the process comprising a high temperature heat treatment step that could generate secondary defects, characterized in that the process includes a wafer surface preparation step before the high temperature heat treatment step. Generally, the wafer includes at least two layers that behave or respond differently to the high temperature heat treatment.

Advantageously, the preparing step includes a thinning operation on the surface layer of the wafer, with this operation including polishing, such as chemical-mechanical polishing, or an ionic or chemical etching, and the wafer preferably includes a silicon support substrate and a surface layer made of Ge or SiGe. The high temperature heat treatment may be RTA annealing or a smoothing annealing.

The process can include any one of a wide variety of second treatments in association with the preparing step designed to prevent the appearance of defect lines during the high temperature heat treatment. The second treatment can include a second heat treatment, preferably one performed before the preparing step, and being carried out with a thermal budget lower than a limiting thermal budget beyond which defects will appear during the high temperature heat treatment. When the wafer is an SOQ wafer, the second heat treatment is carried out with a thermal budget less than or equal to the thermal budget corresponding to two hours of annealing at a temperature of 700° C., while for germanium on silicon wafers, the second heat treatment is carried out with a thermal budget less than or equal to the thermal budget corresponding to two hours of annealing at a temperature of 500° C.

The second treatment can also include a second chemical treatment, preferably one that is carried out after the preparing step, using Reactive Ion Etching ("RIE"), wet or dry etching. The second chemical treatment may include depositing an oxide on the working surface and then selectively etching the oxide so as to define an etching pattern. Instead, the second chemical treatment uses etching on the projecting back face.

Alternatively, the second treatment can include a second mechanical treatment, such as one carried out after the preparing step, using an attack by a diamond, laser or ionic bombardment of neutral molecules. The second mechanical treatment can use local polishing at the ring to make a bevel, and can include the definition of regions that are to be isolated from any singular points in the surface layer of the wafer. To do this, photolithography that etches grooves delimiting the regions in the surface of the said surface layer can be used, so that the isolated regions correspond to required locations at which chips will be formed on the wafer. Thus, regions are defined such that their contour does not form a projecting angle, the top of which could form a singular point that could be associated with a defect line.

BRIEF DESCRIPTION OF THE DRAWINGS

Other aspects, purposes and advantages of the invention will become clearer after reading the following description of the invention made with reference to the attached drawings in which:

FIGS. 4a, 4b1 and 4b2, 4c1 and 4c2 are diagrammatic top views of a multi-layer wafer that has not been treated according to the invention, wherein:

FIG. 4a shows the wafer before the preparation step,

FIGS. 4b1 and 4b2 show the same wafer after the preparation step—"singular points" type defects being shown in FIG. 4b2 which is an enlarged partial view derived from FIG. 4b1, FIGS. 4c1 and 4c2 are diagrammatic views of the same wafer, which have also been subjected to a high temperature heat treatment after the preparation step. Once again in this case, FIG. 4c2 is a partial enlarged view derived from FIG. 4c1. These figures diagrammatically show defect lines that form secondary defects.

FIG. 6 is a view corresponding to the views in FIGS. 5a and 5b, illustrating another embodiment of the invention, and FIGS. 7a to 7c show three diagrammatic representations of top views of wafers, illustrating a variant embodiment of the invention.

DETAILED DESCRIPTION OF THE PREFERRED EMBODIMENTS

Figure 1:
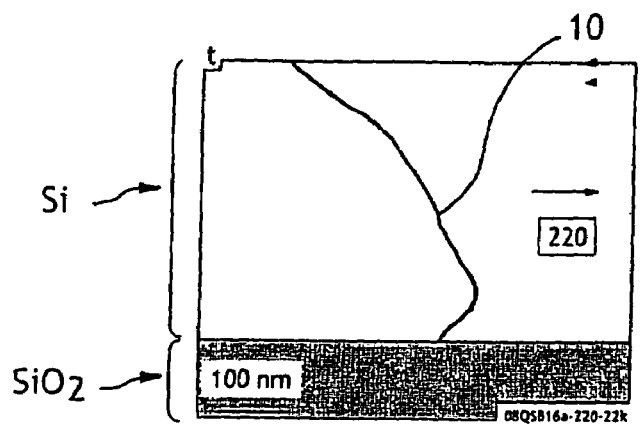
FIGS. 1 and 2 illustrate secondary dislocations in the surface of a wafer as observed by TEM.

As mentioned above, the invention is applicable to multi-layer wafers with differential thermal characteristics.

"Differential thermal characteristics" have been defined above. In particular, they correspond to a difference in the coefficients of thermal expansion of two layers in the wafer, if this difference is large enough to generate secondary defects when the wafer is exposed to a high temperature heat treatment.

In order to avoid the generation of such secondary defects and to apply the demonstration of the "starting point" effect mentioned above demonstrated by the Applicant (initial defects in a wafer—for example defects on its disturbed surface—form starting points from which much larger secondary defects are generated during a high temperature heat treatment), the high temperature heat treatment according to the invention is preceded by a surface preparation step of the wafer to be treated.

This preparation corresponds to a thinning step of the surface layer of the wafer. It may be achieved by polishing (but the preparation step may also include thinning of the surface layer of the wafer by ionic etching—ion or ion cluster bombardment, or by chemical etching—dry or wet). In the case of preparation by polishing, this type of preparation polishing is preferably a mechanical-chemical (CMP) polishing. This type of polishing removes 1000 Å from the surface layer on which the defects are located. It also eliminates initial defects in the surface layer of the wafer that would generate secondary defects observed during a high temperature heat treatment such as a smoothing annealing.

The use of such a preliminary polishing step for example subsequently enables smoothing annealing under a hydrogenated atmosphere for a duration of about two hours, on an SOQ wafer. And this type of smoothing annealing did not generate dislocation type secondary defects (observable in transmission electronic microscopy), defects which are observed in the absence of prior polishing on similar wafers.

Note that the process according to the invention may be used after detachment of the multi-layer wafer from a donor substrate, for example detachment by the addition of heat and/or mechanical energy at a weakening interface. Thus, the invention may be used for example in a SMART-CUT® type process. Remember that the SMART-CUT® process can be used to build up multi-layer wafers and requires a step in which wafers are detached from a substrate. In this context, it is possible to use a SMART-CUT® type technique to make multi-layer wafers with differential thermal characteristics, then to treat these wafers by a high temperature heat treatment such as smoothing annealing, without observing secondary defects (for example of the dislocations type).

In this exemplary embodiment of the invention, insertion of a preparation step (particularly by polishing) between when the wafers are detached and when the high temperature heat treatment is applied, can avoid the appearance of such secondary defects during the high temperature heat treatment. And more generally, the invention can be used to apply high temperature heat treatments to multi-layer wafers with differential thermal characteristics: the invention is not limited to wafers obtained by a SMART-CUT® type process.

Remember that the high temperature heat treatment may be any type of high temperature heat treatment. It may also be done in RTA annealing mode. And regardless of the embodiment, it may be a smoothing annealing. Note that a second treatment can be associated with the preparation step (which then corresponds to a "first" treatment), designed to prevent the appearance of defect lines during the high temperature heat treatment of the wafer. Note also that the terms "first" treatment and "second" treatment do not involve any chronology or any systematic sequence between these two treatments.

The preparation step itself can cause singular points on the wafer (for example at the wafer ring), and these singular points are revealed and amplified during the high temperature heat treatment. For example, these singular points may correspond to material "micro-tearing" points—for example micro-tearing at the wafer ring. Thus, defects arranged in lines (or "defect lines") appear during and after the high temperature heat treatment. These defect lines are due to singular points generated during the preparation (particularly for the case of polishing).

FIGS. 4a, 4b1 and 4b2, 4c1 and 4c2 diagrammatically illustrate generation of these defect lines. FIG. 4a shows a diagrammatic top view of a multi-layer wafer 100 comprising a substrate 110 forming the lower layer, and a surface layer 120. The layer 120 has a diameter slightly less than the diameter of the layer 110, and thus forms a projecting peripheral shoulder that leaves a peripheral part of the surface of the layer 110 exposed. This annular peripheral part is known as "the ring".

FIG. 4a shows the wafer 100 before polishing corresponding to the preparation step. As can be seen, the contour around the ring is regular.

Figure 2:
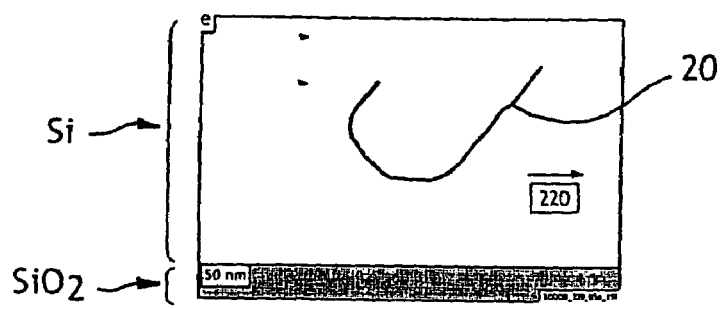
Figure 3:
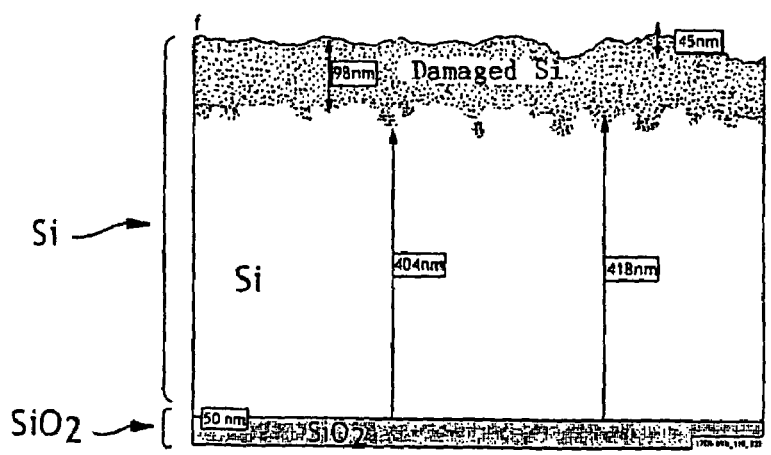
FIG. 3 illustrates disturbances or other initial defects in the surface layer of a wafer prior to heat treatment.

FIGS. 4b1 and 4b2 show corresponding views, representing the wafer 100 after a polishing step has been carried out on it (typically CMP polishing). FIG. 4b2 shows that the polishing has caused micro-tearing points 130 at the wafer ring (these singular points being represented in an exaggerated manner enlarged in the figures).

FIGS. 4c1 and 4c2 illustrate defect lines 140 that can appear starting from these singular points, when a high temperature heat treatment is subsequently applied to the wafer. Therefore a second treatment is performed on the wafers to prevent the appearance of these defect lines during the high temperature heat treatment, in association with the preparation step. As will be seen, the expression "in association with" the preparation step does not imply that the complementary treatment is necessarily done at the same time as the preparation.

The second treatment may also be done before or after the preparation step. In particular, the second treatment may include:
  a heat treatment, and/or
  a mechanical treatment, and/or
  a chemical treatment.

This type of second treatment can limit the generation of singular points (which as described above correspond to points that can give rise to defect lines during a high temperature treatment) during this preparation step. In particular, this limitation of singular points enables limitation of singular points at the wafer ring. Thus, this type of second treatment minimizes or completely prevents the appearance of defect lines during a high temperature treatment.

This second treatment may be done particularly by a thermal, and/or mechanical, and/or chemical process. The main purpose of such a second treatment is to cut around the wafer ring (in other words so that it forms a regular contour).

A second chemical treatment is preferably carried out after the preparation step. This type of second chemical treatment may in particular use wet etching, or dry etching—for example an RIE type dry etching that uses bombardment by particles that are chemically reactive with the bombarded wafer. In this case, the exposed face of the ring needs to be protected in advance. This type of protection is necessary particularly for the case of an RIE type dry etching. The back face of the wafer also needs protection for wet etching.

It is important to avoid using a high temperature heat treatment when performing this type of protection. Therefore, this protection of surfaces to be protected cannot be done by oxidation involving a high temperature heat treatment.

One preferred solution for building up a protection layer consists of depositing an oxide on the surfaces to be protected. In particular, this oxide may be a PECVD (Plasma Enhanced Chemical Vapour Deposition) or LPCVD (Low Plasma Chemical Vapour Deposition) type oxide. The choice between these two types of deposition will depend on the type of operation selected to cut around the wafer ring afterwards, and also on the difference in the coefficient of thermal expansion between the layers of the wafer:
  a PECVD type deposition is done at a temperature of about 400° C., and can therefore be used even on wafers with layers with significantly different coefficients of expansion,
  an LPCVD type deposition is used at a temperature of about 700° C., and therefore can only be used if the coefficients of thermal expansion of the layers in the wafer are fairly similar.

In the case of an SOQ wafer, the two types of deposition could be envisaged since it is observed that defect lines start to appear from a temperature of about 750° C. In the case of a Germanium on silicon wafer, the defect lines may appear at temperatures lower than in the case of an SOQ wafer. Therefore, it will be preferred to use a PECVD type deposition.

Figure 5A:
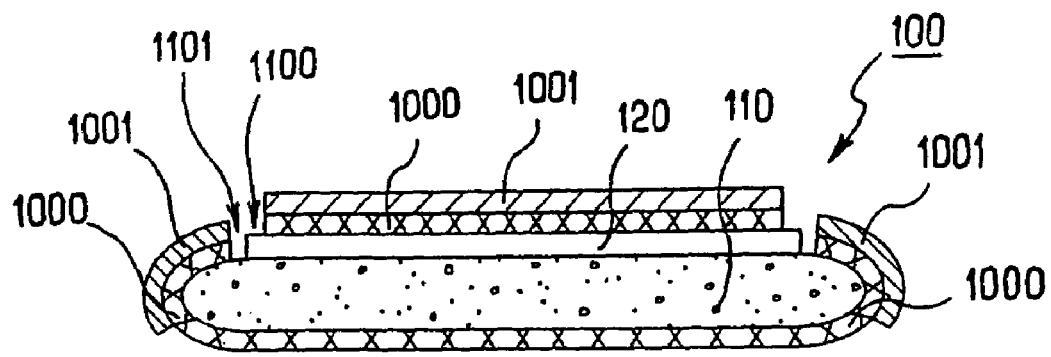
FIGS. 5a and 5b show two diagrammatic representations of steps in one embodiment of a treatment according to the invention (the wafer treated being shown in section in these figures)

The next step after depositing an oxide on all faces of the wafer, is to selectively etch the oxide near the edge of the ring, so as to eliminate this oxide. For example, this selective etching may be done by photolithography. In photolithography, the deposited oxide 1000 has to be covered by a layer of resin 1001 as shown in FIG. 5a. This figure shows a wafer 100 in section, in which the peripheral edge 1101 has been exposed by such a selective etching. The other parts of the wafer remain covered by the protective oxide 1000.

Figure 5B:
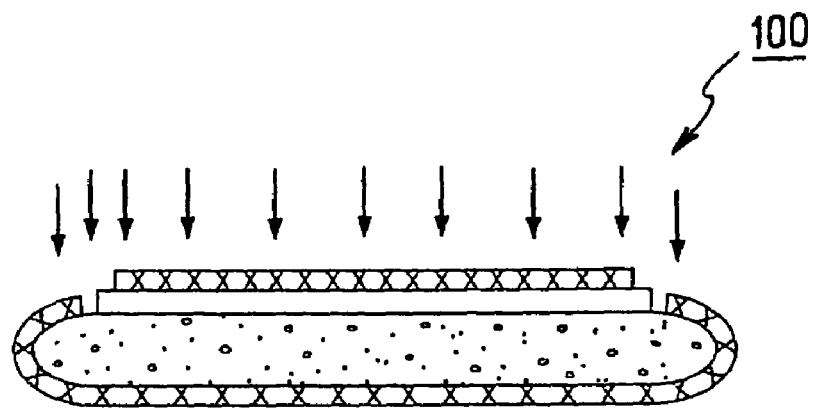

The next step is to remove the resin 1001 and selective etching of silicon around the peripheral edge of the ring, as shown in FIG. 5b (on this figure, the arrows symbolize the etching operation). The result is a ring with a clean and smooth periphery with no singular points. A Spin Etcher type equipment (registered trademark), marketed by the SEZ company could also be used to do this type of selective etching of the ring.

In this variant shown in FIG. 6, the wafer 100 is chemically etched on its back face, opposite to the face on which the ring to be cut around is located. The said back face was covered by a protective layer 1002 before this etching. FIG. 6 shows arrival 20 of the etching product on the back face of the wafer 100. The chemical etching product may be allowed to overlap slightly on the front face of the wafer (facing downwards on the figure), the path of the chemical etching product is shown symbolically in the Figure by arrows. This makes it possible to attack the periphery of the layer 120 and to make the ring uniform.

Note that a neutral gas flow such as nitrogen is applied onto the main face of the layer 120, during this operation so as to avoid chemical etching solutions running on this main face. Etching done according to this variant will be referred to as "overlapping back edge etching".

A second mechanical treatment may also be applied, using mechanical cutting around the ring of the wafer. Like the second chemical treatment process mentioned above, this type of second mechanical process is preferably done after the polishing step. This mechanical treatment may particularly make use of:
  mechanical means for cutting around the ring. This may be done using a diamond, a laser or ionic bombardment of neutral molecules causing cleaning of this ring.
  local polishing at the ring, for bevelling.

And if a second heat treatment process is used, this type of treatment is preferably done before the preparation step.

Note that a second prior treatment carried out in the form of a heat treatment can also consolidate bonding interfaces of the wafer layers (for example between a quartz layer and a silicon layer) before the preparation step. In the case of a second heat treatment, the applicant has also demonstrated the existence of a limiting heat budget beyond which a subsequent high temperature heat treatment would cause the appearance of supplementary defects, and/or encourage the appearance of the defect lines mentioned above. Therefore, the second heat treatment must be carried out with a heat budget that remains less than or equal to this limiting heat budget, which corresponds to a maximum heat input that can be applied to the wafer during this preliminary thermal heat treatment.

The limiting thermal budget depends on the nature of the layers of the treated wafer. And in particular, this limiting thermal budget corresponds to:
  for SOQ wafers, annealing carried out for two hours at a temperature of 700° C.,
  for germanium on silicon wafers, annealing carried out for two hours at a temperature of 500° C.

Obviously, during the second heat treatment, the duration of annealing can be extended for the same thermal budget and the temperature can be lowered, or vice versa.

It has been seen above that different types of "second" treatments can minimize or completely prevent the appearance of defect lines during the high temperature treatment applied to the wafer. Note that the invention is applicable to all types of multi-layer wafers for which materials have differential thermal characteristics. The invention may thus be applied to an SOQ type structure as described. It can also be applied to wafers comprising a surface layer made of Germanium or SiGe (particularly SiGe rich in Germanium) on a support substrate (possibly silicon).

According to one variant embodiment of the invention, it may be required to treat these defect lines only in regions of the wafer in which chips will be formed later (particularly in the useful layer of the wafer). In this variant embodiment of the invention, the second treatment includes definition of regions 1200 that are to be isolated from singular points (singular points that are formed particularly around the periphery of the wafer ring as already mentioned), in the surface layer of the wafer (layer 120 in FIGS. 4a to 4c2, 5 and 6, the same reference being used in FIGS. 7a to 7c).

One or several chips may be located in each region 1200. The regions 1200 can be selectively isolated by photolithography, by etching grooves delimiting the said regions 1200 in the surface of the layer 120. These regions 1200 correspond to the locations required for chips to be formed on the wafer.

FIG. 7a thus very diagrammatically illustrates two wafers 100, each of which includes three regions 1200 that have been isolated from singular points 130 around the edge of the ring, the said singular points being capable of generating defect lines 140. Concerning this variant embodiment of the invention, the applicant also determined that defect lines were preferably oriented along given crystallographic directions.

In particular, this has been observed on SOQ wafers on which a high temperature heat treatment has been applied. Preferably, the contour around regions 1200 is made such that these contours do not have projecting corners that could form a singular point, that could also correspond to an "initial defect". Therefore, contours without projecting angles are preferably made for regions 1200. For example, these contours may be in the form of a circle or an oval. FIGS. 7b and 7c thus illustrate poor configurations in this respect in which the regions 1200 are blocks, in which there are corners in the periphery that should preferably be avoided.

What is claimed is:

1. In a process for treatment of a multi-layer wafer made of materials having differential thermal characteristics wherein the process comprises a high temperature heat treatment that can generate secondary defects in working surfaces of the wafer, the improvement which comprises preparing the working surface(s) of the wafer prior to the high temperature treatment to reduce or eliminate such secondary defects.

2. The process of claim 1, wherein the wafer includes at least two layers that behave or respond differently to the high temperature heat treatment.

3. The process of claim 1, wherein the working surface(s) of the wafer is prepared by thinning the wafer surface layer.

4. The process of claim 1, wherein the working surface(s) of the wafer is prepared by polishing.

5. The process of claim 1, wherein the polishing is mechanical-chemical polishing.

6. The process of claim 1, wherein the working surface(s) is subject to ionic or chemical etching.

7. The process of claim 1, wherein the differential thermal characteristics include a combination of the following conditions:
  at least some layers of the wafer are associated with different thermal expansion coefficients, and
  there is a layer with a significant thickness close to the surface layer of the wafer associated with a coefficient of thermal expansion that is significantly different from the coefficient of thermal expansion associated with the surface layer.

8. The process of claim 1, wherein the wafer comprises a silicon support substrate and a surface layer made of Ge or SiGe.

9. The process of claim 1, wherein the high temperature heat treatment comprises rapid thermal annealing.

10. The process of claim 1, wherein the high temperature heat treatment comprises smoothing annealing.

11. The process of claim 1, which further comprises a second treatment in association with the preparing step designed to prevent the appearance of defect lines during the high temperature heat treatment.

12. The process of claim 11, wherein the second treatment includes a second heat treatment.

13. The process of claim 11, wherein the second heat treatment is conducted prior to the preparing step.

14. The process of claim 11, wherein the second heat treatment is carried out with a thermal budget lower than a limiting thermal budget beyond which defects will appear during the high temperature heat treatment.

15. The process of claim 14, wherein the wafer is an silicon on quartz wafer and the second heat treatment is carried out with a thermal budget less than or equal to the thermal budget corresponding to two hours of annealing at a temperature of 700° C.

16. The process of claim 14, wherein the wafer is a germanium on silicon wafer and the second heat treatment is carried out with a thermal budget less than or equal to the thermal budget corresponding to two hours of annealing at a temperature of 500° C.

17. The process of claim 11, wherein the second treatment includes a second chemical treatment.

18. The process of claim 17, wherein the second chemical treatment is carried out after the preparation step.

19. The process of claim 17, wherein the second chemical treatment comprises wet or dry etching.

20. The process of claim 17, wherein the second chemical treatment comprises deposition of an oxide on the working surface followed by selective etching of the oxide so as to define an etching pattern.

21. The process of claim 17, wherein the second chemical treatment uses overlapping back face etching.

22. The process of claim 11, wherein the second treatment includes a second mechanical treatment.

23. The process of claim 22, wherein the second mechanical treatment is carried out after the preparation step.

24. The process of claim 22, wherein the second mechanical treatment includes diamond cutting or laser or ionic bombardment of neutral molecules.

25. The process of claim 22, wherein the second mechanical treatment uses local polishing at the ring, to make a bevel.

26. The process of claim 25, wherein the second treatment includes the definition of regions to be isolated from any singular points in the surface layer of the wafer.

27. The process of claim 26, wherein the second treatment uses a photolithography that etches grooves delimiting the isolated regions in the surface of the said surface layer.

28. The process of claim 27, wherein the isolated regions correspond to required locations at which chips will be formed on the wafer.

29. The process of claim 28, wherein the isolated regions are defined such that their contour does not form a point defect.

* * * * *

UNITED STATES PATENT AND TRADEMARK OFFICE
CERTIFICATE OF CORRECTION

PATENT NO. : 6,991,944 B2
DATED : January 31, 2006
INVENTOR(S) : Rayssac et al.

It is certified that error appears in the above-identified patent and that said Letters Patent is hereby corrected as shown below:

Title page,
Item [73], Assignee, after "S.O.I. Tec Silicon on" change "Insulation" to
-- Insulator --.
Item [56], References Cited, OTHER PUBLICATIONS, "D. Buttard et al." reference, after "IEEE Journal of Quantum Electronics, vol. 38, No. 8, pp." change "1995-1005" to
-- 995-1005 --.

Signed and Sealed this

Twenty-eighth Day of March, 2006

JON W. DUDAS
*Director of the United States Patent and Trademark Office*